(12) United States Patent
Wedel et al.

(10) Patent No.: US 8,000,757 B2
(45) Date of Patent: Aug. 16, 2011

(54) SIDE KEY SEAL FOR A PORTABLE ELECTRONIC DEVICE

(75) Inventors: Martin Wedel, Furulund (SE); William H. Tolbert, Malmö (SE)

(73) Assignee: Sony Ericsson Mobile Communications AB, Lund (SE)

( * ) Notice: Subject to any disclaimer, the term of this patent is extended or adjusted under 35 U.S.C. 154(b) by 362 days.

(21) Appl. No.: 12/276,505

(22) Filed: Nov. 24, 2008

(65) Prior Publication Data

US 2010/0105451 A1 Apr. 29, 2010

Related U.S. Application Data

(60) Provisional application No. 61/108,909, filed on Oct. 28, 2008.

(51) Int. Cl.
*H04M 1/00* (2006.01)
(52) U.S. Cl. ............... 455/575.1; 455/575.8; 455/90.3
(58) Field of Classification Search ............... 455/575.1, 455/575.8, 90.3
See application file for complete search history.

(56) References Cited

U.S. PATENT DOCUMENTS

| 5,655,018 | A | 8/1997 | Estevez-Alcolado et al. |
| 7,251,512 | B2 * | 7/2007 | Komiyama ............... 455/575.3 |
| 2005/0181745 | A1 * | 8/2005 | Wood et al. ............... 455/90.3 |
| 2007/0034493 | A1 | 2/2007 | Kawasaki et al. |

FOREIGN PATENT DOCUMENTS

DE  101 07 436  8/2002

OTHER PUBLICATIONS

International Search Report and Written Opinion for corresponding application No. PCT/IB2009/005347 dated Jul. 29, 2009.

* cited by examiner

*Primary Examiner* — Temica M Beamer
(74) *Attorney, Agent, or Firm* — Renner, Otto, Boisselle & Sklar, LLP

(57) ABSTRACT

A seal section for a side key of a portable electronic device is provided contiguously with a main seal. The seal section includes a flexible exterior and an exposed portion, the exposed portion facing the device exterior toward an adjacent side key. The flexible exterior also includes an extension opposite the exposed portion that extends inward toward the interior of the device. When a user depresses a side key, the inward movement of the side key is transmitted through the seal section via the exposed portion and inward extension. The inward movement of the side key is thus transmitted through the seal section to a switching element to convert the manual user input into an electrical input signal command. In this manner, side keys may be sealed without having to provide separate sealing elements, while maintaining the functionality of the side keys.

16 Claims, 6 Drawing Sheets

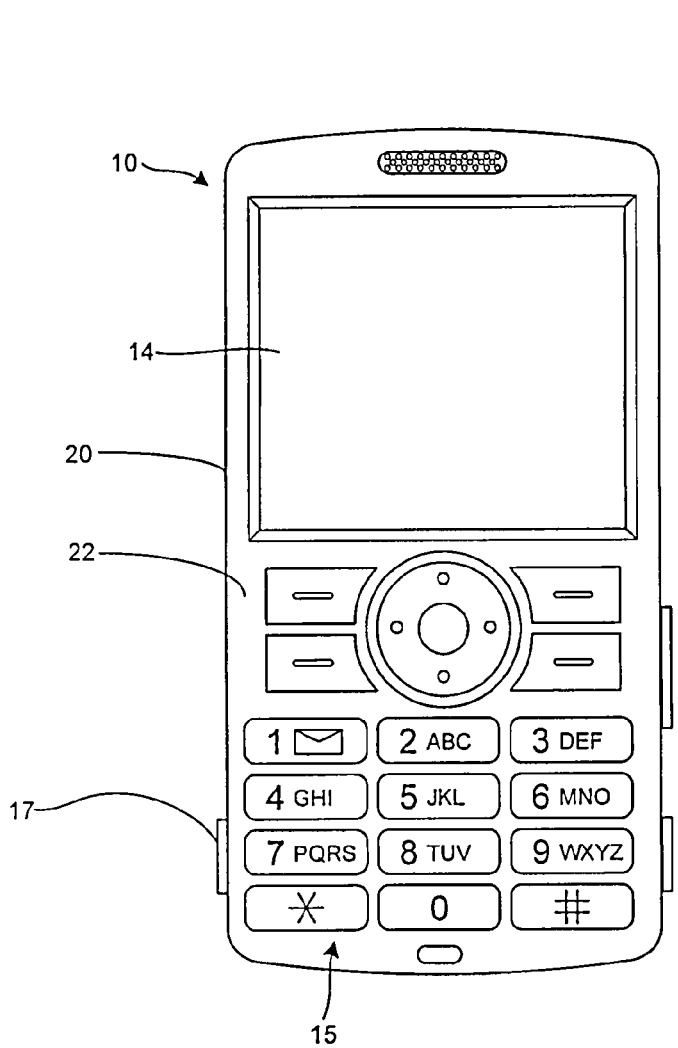
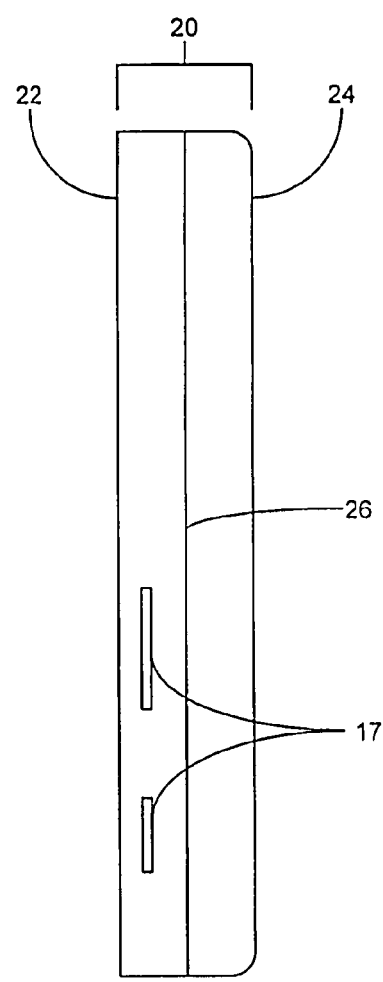
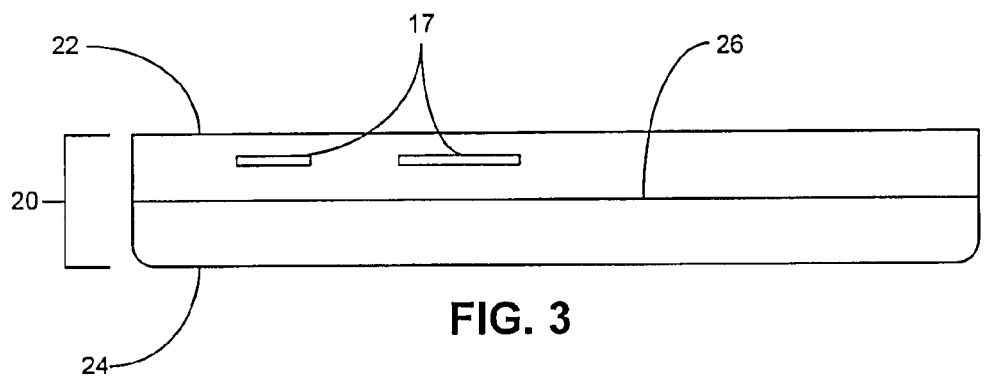
FIG. 1
FIG. 2
FIG. 3

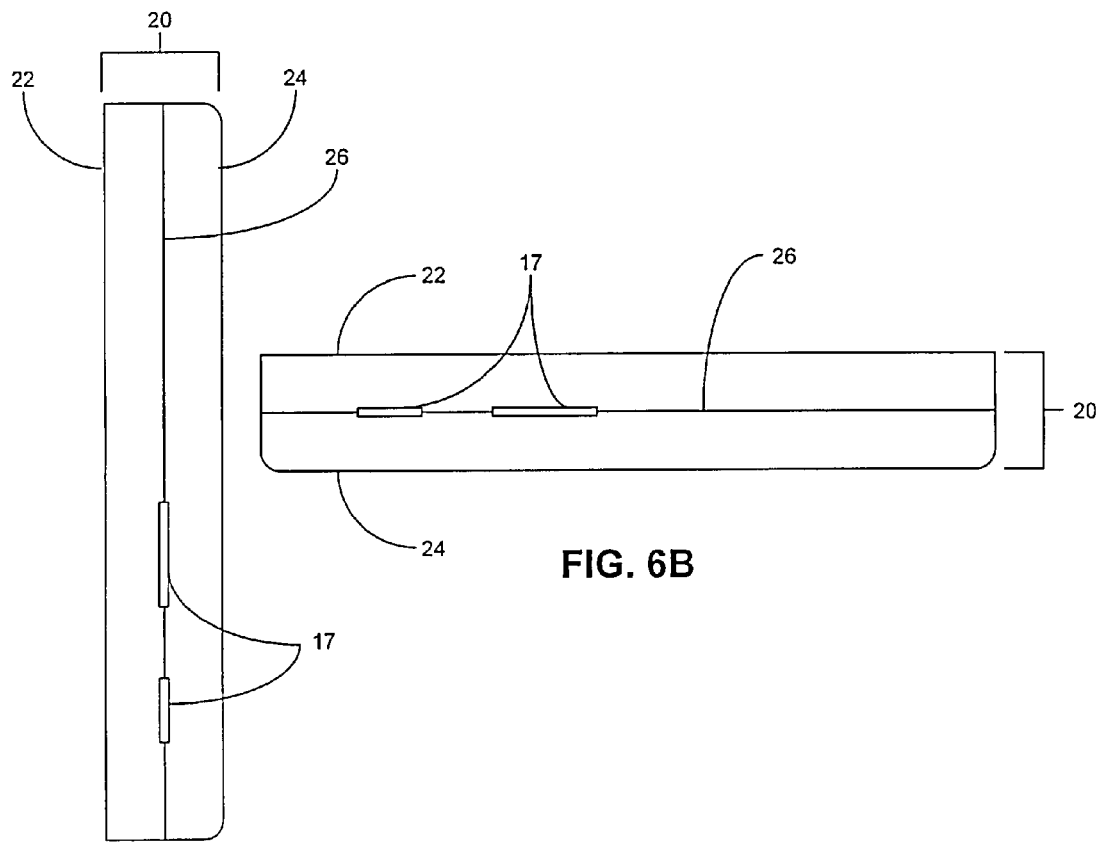
FIG. 6A
FIG. 6B
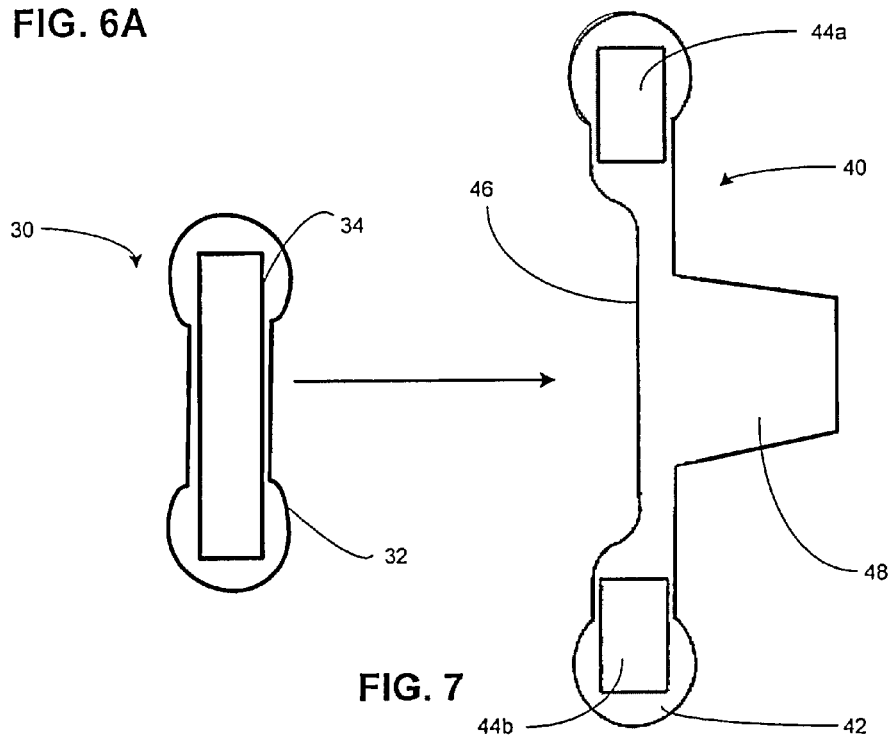
FIG. 7

SIDE KEY SEAL FOR A PORTABLE ELECTRONIC DEVICE

RELATED APPLICATION DATA

The present application claims the benefit of U.S. Provisional Application Ser. No. 61/108,909, filed Oct. 28, 2008, the disclosure of which is herein incorporated by reference in its entirety.

TECHNICAL FIELD OF THE INVENTION

The present invention relates to portable electronic devices, and more particularly to a system for sealing side keys of a portable electronic device against moisture, dust, and other external substances.

DESCRIPTION OF THE RELATED ART

Portable electronic devices, such as mobile telephones, media players, personal digital assistants (PDAs), and others, are ever increasing in popularity. To avoid having to carry multiple devices, portable electronic devices are now being configured to provide a wide variety of functions. For example, a mobile telephone may no longer be used simply to make and receive telephone calls. A mobile telephone may also be a camera (still and/or video), an Internet browser for accessing news and information, an audiovisual media player, a messaging device (text, audio, and/or visual messages), a gaming device, a personal organizer, and have other functions as well.

Because of this versatility, many people rarely leave home without a portable electronic device. It is common, therefore, for such devices to be exposed to the elements, such as precipitation, dust, moisture, and various other forms of external substances. Exposure to such substances can cause damage to delicate internal and electronic components of the device, and therefore sealing elements are provided to protect the internal components from exposure.

The following description is made in the context of a conventional mobile telephone. It will be appreciated that the description is not intended to be limited to the context of a mobile telephone and may relate to any type of appropriate electronic device. Such devices may include any portable radio communication equipment or mobile radio terminal, including mobile telephones, pagers, communicators, electronic organizers, personal digital assistants (PDAs), smartphones, and any communication apparatus or the like.

FIGS. 1-3 depict a conventional configuration of a mobile telephone 10. The mobile telephone may have a "block" or "brick" configuration in which a rigid housing 20 includes a front plate 22 and a back plate 24. It will be appreciated that mobile telephone 10 may have other configurations, such as a clam shell configuration, slide or swivel cover configuration, or comparable configuration in which one portion of the mobile telephone is moveable relative to another. It will be appreciated that in such configurations, one or more of the movable components each may be sectioned into front and back plates. Therefore, although this description is in the context of a block or brick configuration, comparable principles may be applied to other device configurations.

Mobile telephone 10 has a display 14 for displaying information to a user regarding the various features and operating state of the mobile telephone, and for displaying visual content received by the mobile telephone and/or retrieved from a memory. Display 14 may be used to display text, pictures, video, the video portion of multimedia content, and various other forms of other visual information and combinations thereof.

Mobile telephone 10 may include a keypad 15 that provides for a variety of user input operations. For example, keypad 15 typically includes alphanumeric keys for allowing entry of alphanumeric information such as telephone numbers, phone lists, contact information, notes, etc. In addition, keypad 15 typically includes special function keys such as a "send" key for initiating or answering a call, and others. Some or all of the keys may be used in conjunction with the display as soft keys. Keys or key-like functionality also may be embodied as a touch screen associated with the display 14. In addition, the keypad may include one or more side keys 17. The exemplary device of FIG. 1 includes three side keys, although the precise number and orientation may vary.

FIGS. 2 and 3 are schematic side views of the mobile telephone of FIG. 1 viewed toward the right side of FIG. 1. FIG. 3 is a clockwise rotated view relative to FIG. 2. In a typical method of manufacturing a portable electronic device, the various internal components are set within a portion of the housing. Once set, a second portion of the housing is placed to cover the various internal components, and the two housing portions may be sealed to prevent exposure of the internal components to moisture, dust, and various other external substances that may be damaging. For example, the internal components may be set within the back plate 24, and then covered by the placement of the front plate 22 to form the housing 20.

As seen in FIGS. 2 and 3, because the housing 20 is formed by two components 22 and 24, a gap 26 is present separating the front plate 22 and back plate 24. Though small, the gap still may expose the internal components to damaging elements, and therefore the gap typically may be sealed. As further described below, the seal tends to be provided internally within the housing, and therefore the seal is not visible in the views represented by FIGS. 2 and 3.

FIGS. 2 and 3 depict an exemplary location of two of the side keys 17, which would be viewable from the represented viewpoints. As depicted in these figures, the side keys conventionally are incorporated within one of the plates of the housing. For example, in FIGS. 2 and 3 the side keys 17 are incorporated within the front plate 22. Additionally or alternatively, one or more side keys may be incorporated into the back plate 24.

FIG. 4 depicts a cross-sectional view of a conventional configuration of a seal 30 across the gap 26 between the front plate 22 and back plate 24. In particular, an internal main seal 30 spans the gap 26 to prevent penetration of moisture, dust, and other external substances into interior 28 of the mobile telephone. As stated above, the figure depicts a cross-section, and it will be appreciated that the internal main seal 30 may extend substantially around the entire perimeter of the mobile telephone so as to provide a seal across the entire gap 26.

As seen in FIG. 4, and in the enlarged cross-section of the seal depicted in FIG. 5, the conventional seal 30 includes a flexible exterior 32 surrounding an interior stiffener 34. The flexible exterior 32 may be made of various rubber-like materials as are known in the art, such as rubber, silicone, and other flexible or malleable plastic or polymer materials. When in place, the flexible exterior 32 may conform to its compartment to provide an appropriate seal. The stiffener may be wholly contained within the exterior 32 and provides strength and support across the gap 26. The stiffener 34 may be made of any rigid material, typically metal, rigid plastic, or the like.

The conventional configuration described above has deficiencies in the manner by which it provides for sealing the internal components as against moisture, dust, and other external substances. In particular, the side keys 17 are in communication with internal circuitry for converting manual user inputs into electrical signals to implement input commands. The side keys, therefore, also provide potential entry points of foreign substances that may damage the internal components of the device. Accordingly, the side keys must be sealed in addition to the gap between the plates of the housing. The need to separately seal the side keys increases the complexity and cost of manufacturing, and provides a source of potential failure points of the overall sealing of the device, which may lead to contamination and damage of the internal components.

SUMMARY

Accordingly, there is a need in the art for an improved system for sealing a portable electronic device to prevent exposure of the internal components to potentially damaging external substances. In particular, there is a need in the art for an improved system for sealing side keys in a manner that is more efficient and yet still provides the desired protection from foreign substances.

In an exemplary embodiment, one or more side keys are positioned along a main seal in a configuration that obviates the conventional need to seal the side keys separately from the main seal. Adjacent each side key, the seal may be modified from the main seal configuration into a seal section to seal the side keys. The seal section for the side keys may have a stretched configuration relative to the configuration of the main seal, such that the length of a cross section of the seal section is greater than the length of a cross section of the main seal. The seal section for the side keys may include a flexible exterior section and an exposed portion, the exposed portion facing the device exterior toward an adjacent side key. The flexible exterior also may have an extension opposite the exposed portion that extends inward toward the interior of the device. The extension is in communication with a switching element for converting a manual user input into an electrical input command signal. When a user depresses a side key, the inward movement of the side key is transmitted through the seal section via the exposed portion and inward extension. The inward movement of the side key is thus transmitted to the switching element to convert the manual user input into an electrical input command signal. In this manner, side keys may be sealed along the main seal without having to provide separate sealing elements, while maintaining the functionality of the side keys.

Therefore, according to one aspect of the invention, a seal is provided for sealing internal components of an electronic device against exposure to external substances. The seal comprises a main seal including a flexible exterior, and a seal section contiguous with the main seal, the seal section being associated with a side key of the electronic device. The seal section comprises a flexible exterior section and an exposed portion in communication with the side key, wherein movement of the side key as a result of a manual user input is transmitted into movement of the exposed portion to permit the functioning of the side key.

According to one embodiment of the seal, the main seal further comprises a stiffener at least partially contained within the flexible exterior, and the seal section further comprises at least one stiffener element at least partially contained within the flexible exterior section.

According to one embodiment of the seal, the flexible exterior section of the seal section is contiguous with the flexible exterior of the main seal.

According to one embodiment of the seal, the at least one stiffener element of the seal section is contiguous with the stiffener of the main seal.

According to one embodiment of the seal, the seal section has two discontinuous stiffener elements contiguous with the stiffener of the main seal, and the exposed portion is between the stiffener elements such that the exposed portion moves between the stiffener elements.

According to one embodiment of the seal, one of the stiffener elements is along a first edge of the side key and the other of the stiffener elements is along a second edge of the side key opposite the first edge.

According to one embodiment of the seal, a cross-section of the seal section has a greater length than a cross section of the main seal.

According to one embodiment of the seal, the seal section further comprises a side key formed integrally with the flexible exterior section.

Another aspect of the invention is an electronic device comprising a housing for housing a plurality of internal components, a side key for receiving a manual user input, and a seal for sealing the internal components against exposure to external substances. The seal includes a main seal extending substantially around a perimeter of the housing, the main seal including a flexible exterior, and a seal section contiguous with the main seal, the seal section being associated with the side key of the electronic device. The seal section comprises a flexible exterior section and an exposed portion in communication with the side key, wherein movement of the side key as a result of the manual user input is transmitted into movement of the exposed portion to permit the functioning of the side key.

According to one embodiment of the electronic device, the main seal further comprises a stiffener at least partially contained within the flexible exterior, and the seal section further comprises at least one stiffener element at least partially contained within the flexible exterior section.

According to one embodiment of the electronic device, the flexible exterior section of the seal section is contiguous with the flexible exterior of the main seal.

According to one embodiment of the electronic device, the at least one stiffener element of the seal section is contiguous with the stiffener of the main seal.

According to one embodiment of the electronic device, the seal section has two discontinuous stiffener elements contiguous with the stiffener of the main seal, and the exposed portion is between the stiffener elements such that the exposed portion moves between the stiffener elements.

According to one embodiment of the electronic device, one of the stiffener elements is along a first edge of the side key and the other of the stiffener elements is along a second edge of the side key opposite the first edge.

According to one embodiment of the electronic device, the housing comprises a front plate and a back plate that define a gap between the front plate and the back plate, and the main seal and seal section extend around the perimeter of the electronic device along the gap between the front plate and the back plate.

According to one embodiment of the electronic device, the side key spans the gap between the front plate and the back plate.

According to one embodiment of the electronic device, a cross-section of the seal section has a greater length than a cross-section of the main seal.

According to one embodiment of the electronic device, the electronic device further comprises a switching element, wherein the movement of the exposed portion activates the switching element, and the activated switching element generates a command signal corresponding to the user input.

According to one embodiment of the electronic device, the seal section further comprises an extension opposite the exposed portion and the extension moves against the switching element to activate the switching element.

According to one embodiment of the electronic device, the side key is formed integrally with the flexible exterior section of the seal section.

According to one embodiment of the electronic device, the electronic device is a mobile telephone.

These and further features of the present invention will be apparent with reference to the following description and attached drawings. In the description and drawings, particular embodiments of the invention have been disclosed in detail as being indicative of some of the ways in which the principles of the invention may be employed, but it is understood that the invention is not limited correspondingly in scope. Rather, the invention includes all changes, modifications and equivalents coming within the spirit and terms of the claims appended hereto.

Features that are described and/or illustrated with respect to one embodiment may be used in the same way or in a similar way in one or more other embodiments and/or in combination with or instead of the features of the other embodiments.

It should be emphasized that the terms "comprises" and "comprising," when used in this specification, are taken to specify the presence of stated features, integers, steps or components but do not preclude the presence or addition of one or more other features, integers, steps, components or groups thereof.

BRIEF DESCRIPTION OF THE DRAWINGS

FIGS. 1-3 are schematic diagrams depicting a conventional mobile telephone as an exemplary electronic device.

FIGS. 6A-6B are schematic diagrams of side views of an exemplary electronic device having side keys.

FIG. 7 is cross-sectional diagrams depicting an exemplary modification of a seal to modify a main seal configuration to a seal section for a side key.

DETAILED DESCRIPTION OF EMBODIMENTS

Figure 4:
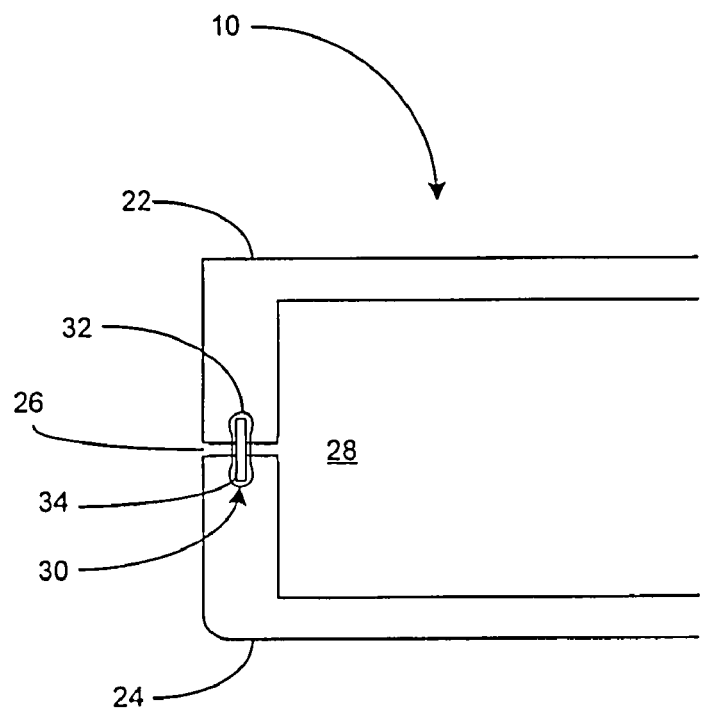
FIG. 4 is a cross-sectional schematic diagram depicting a conventional configuration of a seal for an exemplary electronic device such as that depicted in FIGS. 1-3.
Figure 5:
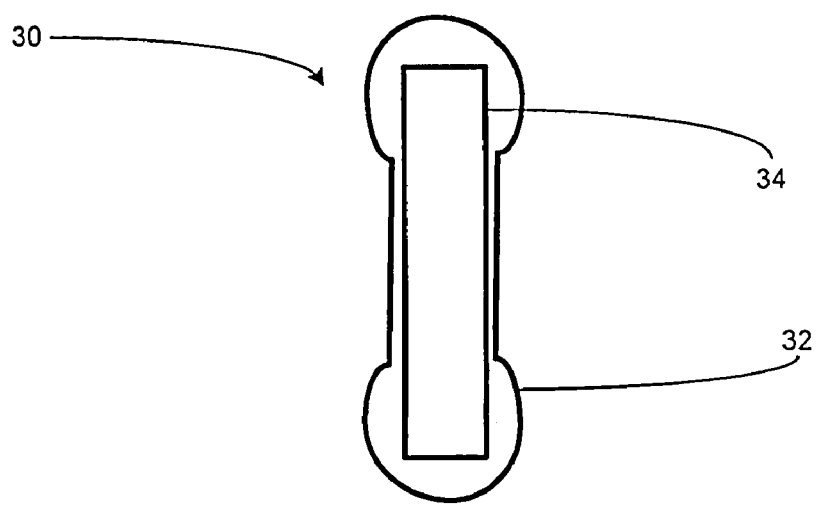
FIG. 5 is an enlarged cross-sectional schematic diagram of the seal of FIG. 4.

Embodiments of the present invention will now be described with reference to the drawings, wherein like reference numerals are used to refer to like elements throughout. It will be understood that the figures are not necessarily to scale.

FIGS. 6A and 6B depict side views of an exemplary mobile telephone 10 as modified from the conventional configuration to provide improved sealing capabilities. FIG. 6B is a clockwise rotated view relative to FIG. 6A. In contrast to the conventional configuration as depicted in FIGS. 2 and 3, in the configuration depicted in FIGS. 6A and 6B, the side keys 17 are positioned to straddle the gap 26. As further described below, the seal is modified from the configuration of the main seal 30 adjacent the side keys to provide a seal while simultaneously permitting side key function. Because sealing around the side keys 17 is accomplished by a seal section contiguous with the main seal 30, separate sealing components are not necessary to seal the side keys. Because there are fewer sealing components, manufacturing may be simplified and less costly, and the number of potential failure points for the sealing features are reduced. The result is a more effective seal that is more easily produced as compared to the current conventional configuration.

FIG. 7 depicts a cross-sectional view of the seal configuration as it is modified in the region containing a side key, the modification being indicated by the straight arrow in the figure. In particular, the seal may be modified from the configuration of the main seal 30 to have a contiguous seal section 40 within the region of a side key. As depicted, seal section 40 may be stretched relative to the conventional configuration of the main seal 30 such that the length of a cross section of the seal section 40 is greater than the length of a cross section of the main seal 30. Seal section 40 may have a flexible exterior section 42 comparable in materials to the flexible exterior 32 of the main seal 30. In one embodiment, the flexible exterior section 42 of the seal section 40 may be contiguous with the flexible exterior 32 of the main seal 30. Further contrasting the main seal 30 and seal section 40, in the seal section 40 the stiffener has been divided into two discontinuous stiffener elements 44a and 44b. In one embodiment, the stiffener elements 44a and 44b of the seal section 40 may be contiguous with the stiffener 34 of the main seal 30. Portions of the flexible exterior section 42 include an exposed portion 46, which lacks a stiffener element and faces the device exterior. The flexible exterior section 42 also may have an extension 48 opposite the exposed portion 46. As further described below, the exposed portion 46 and the extension 48 cooperate with a given side key to permit side key functionality along the seal section 40.

It will be appreciated that the stiffener 34 and stiffener elements 44a and 44b are optional components. In one embodiment, therefore, separate stiffening elements are not present and the flexible exterior of the main seal and seal section provide for the entire sealing. In addition, the stiffener/stiffener elements need not be wholly contained within the flexible exterior. Rather, they may be only partially contained and extend outward of the surface of the seal.

Figure 8:
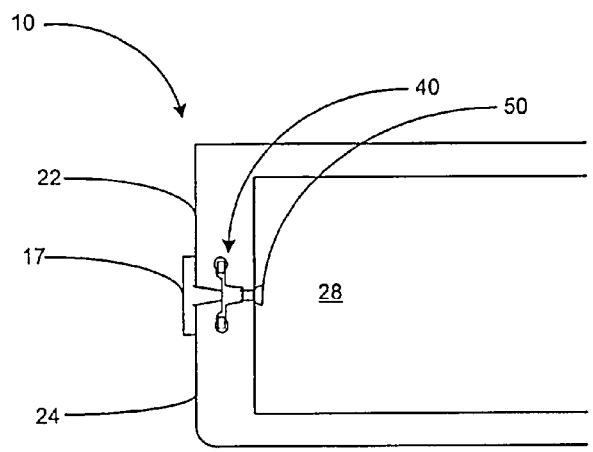
FIG. 8 is a cross-sectional schematic diagram depicting an exemplary configuration of a seal section for a side key in an electronic device.
Figure 9:
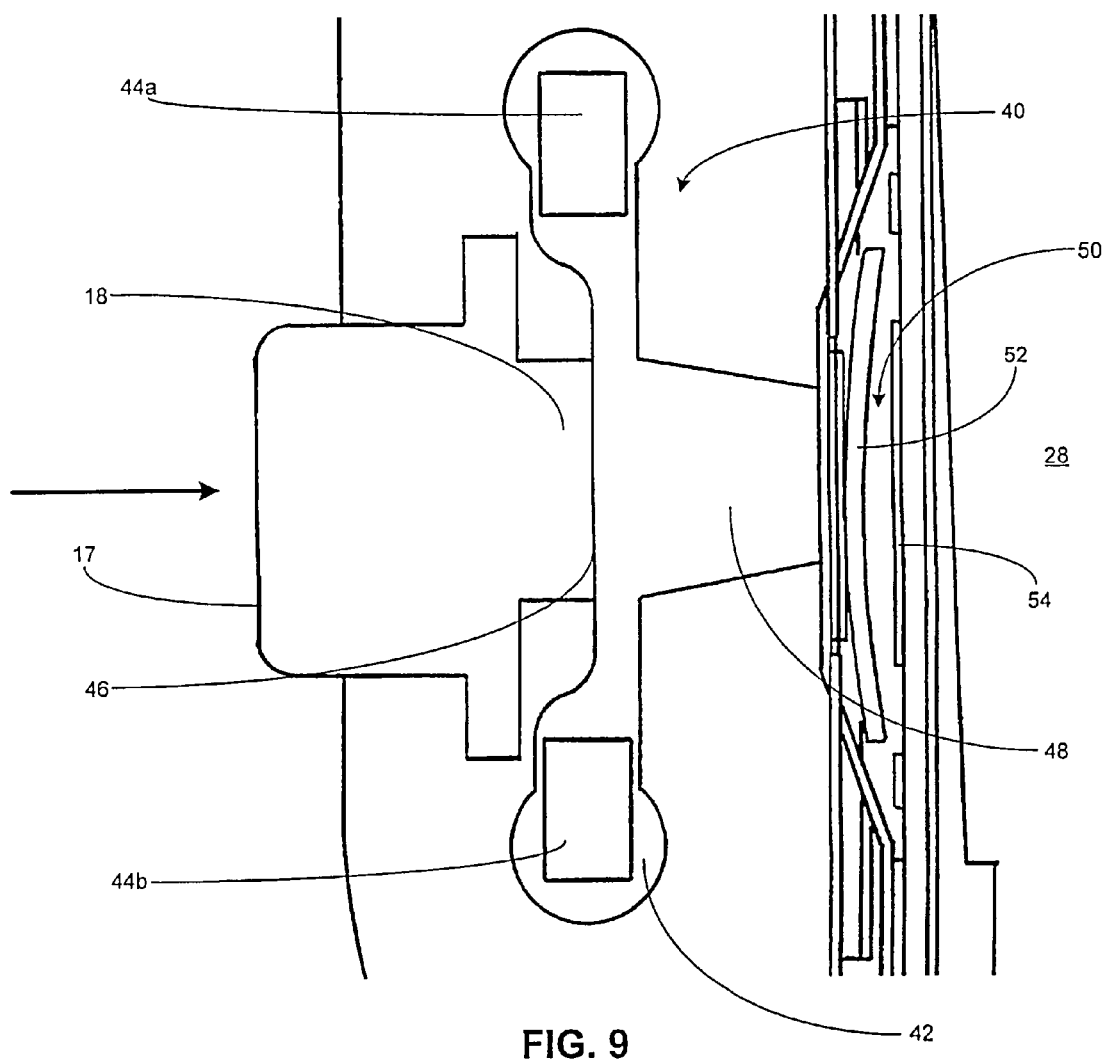
FIG. 9 is a magnified cross-sectional schematic diagram depicting an exemplary configuration of a seal section for a side key in an electronic device.

FIG. 8 depicts a cross-sectional view of a portion of an exemplary electronic device 10 containing a side key 17. This figure further depicts an exemplary positioning of the seal section 40 adjacent the side key 17. FIG. 9 depicts a magnified view of the side key 17 and seal section 40 from FIG. 8.

As seen in these figures, the side key 17 is positioned to span the front plate 22 and back plate 24 of the electronic device. The side key 17 has an extension 18 that extends from the side key toward the interior 28 of the electronic device. The extension 18 is in communication with the exposed portion 46 of the flexible exterior section 42 of the seal section 40. In operation, a user may provide a manual or tactile input to the electronic device by pressing the side key in the direction of the arrow as indicated in FIG. 9. The pressing force of the user causes the side key (including the extension 18) to move inward. The inward motion of the side key is thus transmitted to the exposed portion 46. In the region of the side key, the stiffener elements 44a and 44b are discontinuous or apart from each other and do not receive the pressing force. In other words, because the exposed portion 46 lacks a stiffener element, the seal section 40 is flexible in the area of the side key extension 18. The inward motion of the side key, therefore, is transmitted through the seal section 40 via the exposed portion 46 and extension 48. This portion of the seal section 40, therefore, also moves inward toward the interior 28 of the device. The inward motion of the seal section 40 may activate a switching element 50, such as by causing components of the switching element 50 to depress. In this manner, an upper contact 52 may contact a base contact 54 to complete an electrical circuit by which the user pressing force upon the side key may be converted into an electrical input command signal. It will be appreciated that the switching element 50 may be in the form of a dome switch configuration or other switch configuration that may be used for tactile key inputs.

In one embodiment, the side key 17 and seal section 40 are not separate components. Rather, the side key 17 may be integral with the seal section 40. For example, the side key 17 may be formed integrally with the flexible exterior section 42 of the seal section 40, such as by molding these structures from the same material as a unitary component.

Figure 10:
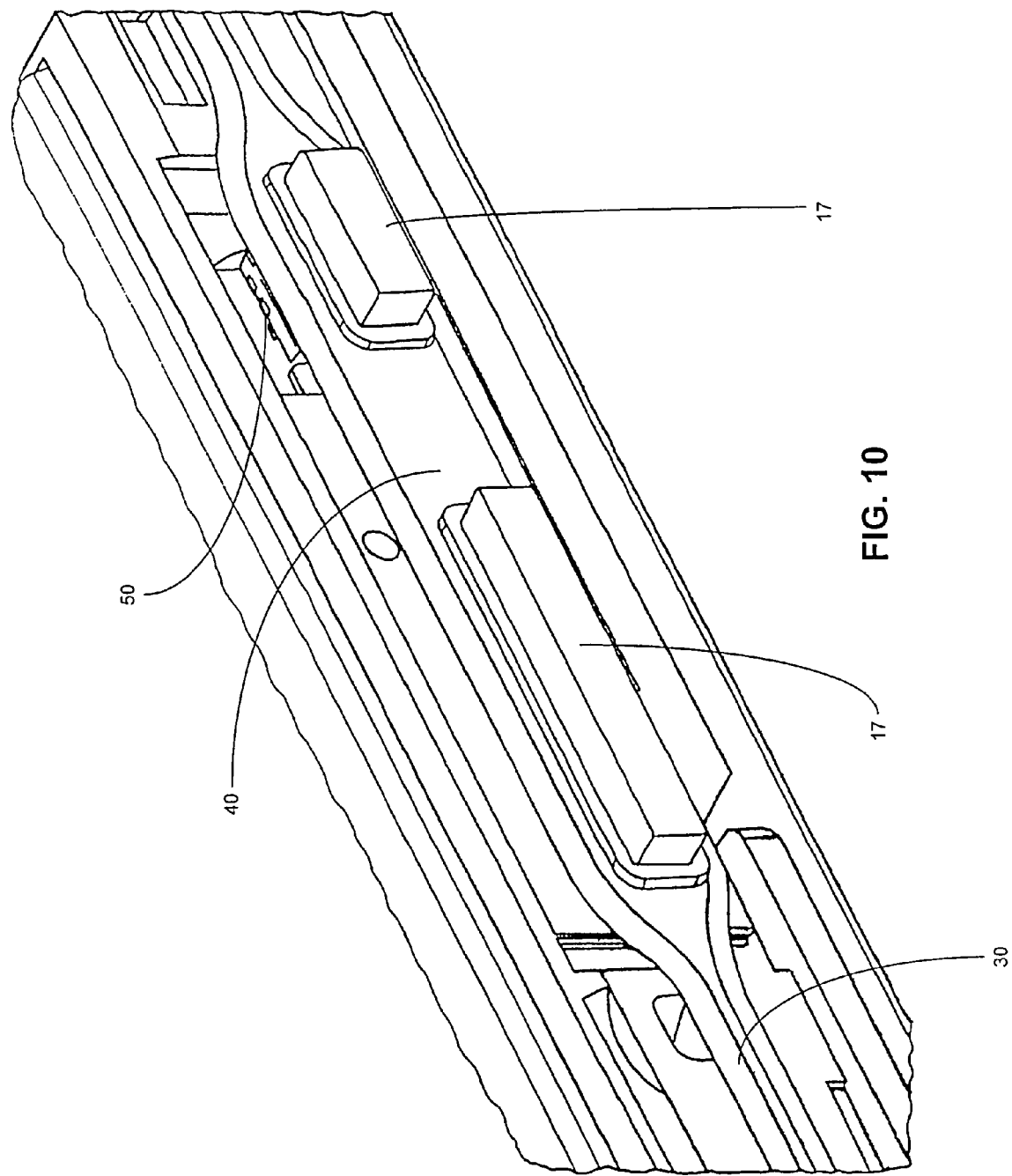
FIG. 10 is a schematic diagram depicting an exemplary positioning of sealed side keys within an electronic device.

FIG. 10 is a schematic diagram depicting an exemplary positioning of sealed side keys within an electronic device in accordance with the above description. In this embodiment, the main seal 30 is contiguous with the seal section 40 adjacent one or more side keys 17. It will be appreciated that the main seal 30, together with any seal sections 40, would extend substantially around the perimeter of the electronic device to provide a complete, contiguous seal. In this figure, only the flexible exteriors 32 and 42 of the main seal 30 and seal section 40 are visible. The various stiffeners elements would be contained within the flexible exteriors. The shapes of the main seal 30 and seal section 40 represent examples, and the precise shape of the various sealing elements may be varied.

Figure 11:
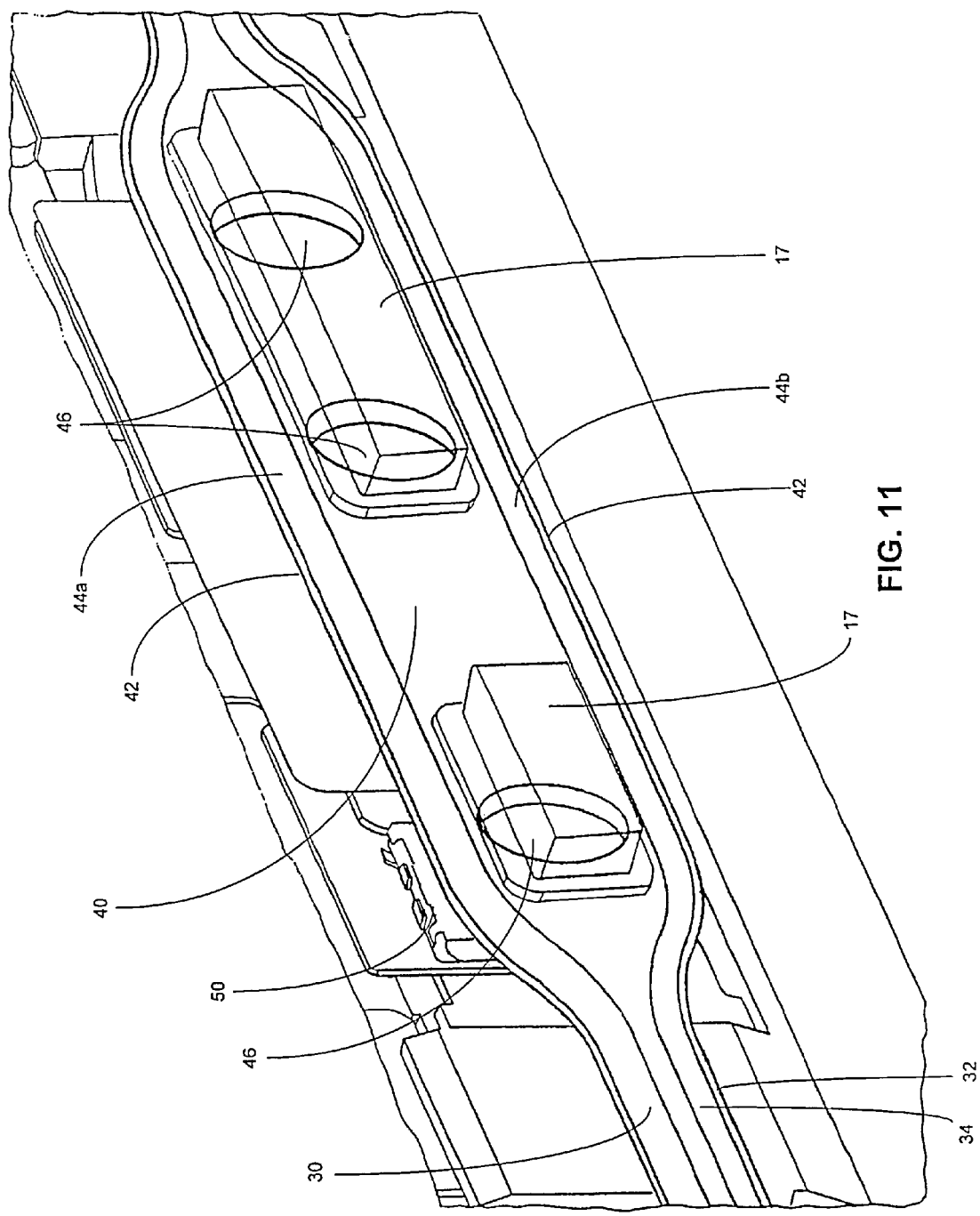
FIG. 11 is a schematic diagram depicting an exemplary positioning of sealed side keys within an electronic device, with certain elements depicted in a transparent form.

FIG. 11 is another schematic diagram depicting an exemplary positioning of sealed side keys within an electronic device in accordance with the above description. In this figure, portions of the side keys and seal are represented in a transparent form. It again will be appreciated that the main seal 30, together with any seal sections 40, would extend substantially around the perimeter of the electronic device to provide a complete, contiguous seal. In this embodiment, main seal 30 includes the flexible exterior 32 and the stiffener element 34 contained within. In addition, seal section 40 is adjacent the side keys 17. Seal section 40 includes a flexible exterior 42. Upper stiffening element 44a and lower stiffening element 44b are contained within the seal section 40. In this embodiment, one stiffener element 44a is along a first or upper edge of the side key 17, and the other stiffener element 44b is along a second or lower edge of the side key 17 opposite the first or upper edge. In addition, each of the stiffener elements 44a and 44b may be contiguous with a portion of the stiffener element 34 of the main seal 30.

In this embodiment, circular portions of the stiffener elements have been cut away beneath the side keys 17 to expose exposed portions 46 of the seal section 40. As stated above, because the stiffener elements have been cut away in these regions, exposed portions 46 are flexible. When a user depresses a side key, the inward movement of the side key is transmitted through the seal section 40 via an exposed portion 46. The movement is thus transmitted to the switching element 50 to activate the switching element and convert the user pressing force into an input signal command. As stated above, the shapes of the main seal 30 and seal section 40 represent examples, and the precise shape and configuration of the various sealing elements may be varied. In addition, the precise shape of the exposed portions 46 may be varied.

As stated above, it will be appreciated that the stiffener 34 and stiffener elements 44a and 44b are optional components. In one embodiment, therefore, separate stiffening elements are not present and the flexible exterior of the main seal and seal section provide for the entire sealing. In addition, the stiffener/stiffener elements need not be wholly contained within the flexible exterior. Rather, they may be only partially contained and extend outward of the surface of the seal.

In the manner described herein, side keys are sealed by positioning them along the main seal, and by modifying the main seal into a contiguous seal section to accommodate the side keys without interfering with side key functionality. By virtue of this configuration, there is no separate seal of the side keys apart from or discontinuous from the main seal. By not separately sealing the side keys, the seal configuration described herein has less points of potential failure, and may be less complex and costly to manufacture, as compared to conventional side key sealing configurations.

Although the invention has been shown and described with respect to certain preferred embodiments, it is understood that equivalents and modifications will occur to others skilled in the art upon the reading and understanding of the specification. The present invention includes all such equivalents and modifications, and is limited only by the scope of the following claims.

The invention claimed is:

1. A seal for sealing internal components of an electronic device against exposure to external substances, the seal comprising:
   a main seal comprising a flexible exterior and a stiffener at least partially contained within the flexible exterior; and
   a seal section contiguous with the main seal, the seal section being associated with a side key of the electronic device and comprising:
      a flexible exterior section;
      at least one stiffener element at least partially contained within the flexible exterior section, wherein the at least one stiffener element of the seal section is contiguous with the stiffener of the main seal; and
      a flexible exposed portion adjacent the at least one stiffener element and in communication with the side key, wherein movement of the side key as a result of a manual user input is transmitted into movement of the exposed portion to permit the functioning of the side key.

2. The seal of claim 1, wherein the flexible exterior section of the seal section is contiguous with the flexible exterior of the main seal.

3. The seal of claim 1, wherein the seal section has two discontinuous stiffener elements contiguous with the stiffener of the main seal, and the exposed portion is between the stiffener elements such that the exposed portion moves between the stiffener elements.

4. The seal of claim 3, wherein one of the stiffener elements is along a first edge of the side key and the other of the stiffener elements is along a second edge of the side key opposite the first edge.

5. The seal of claim 1, wherein a cross-section of the seal section has a greater length than a cross section of the main seal.

6. The seal of claim 1, wherein the seal section further comprises a side key formed integrally with the flexible exterior section.

7. An electronic device comprising:
   a housing for housing a plurality of internal components;

a side key for receiving a manual user input; and
a seal for sealing the internal components against exposure to external substances, the seal comprising:
  a main seal extending substantially around a perimeter of the housing, the main seal comprising a flexible exterior and a stiffener at least partially contained within the flexible exterior; and
  a seal section contiguous with the main seal, the seal section being associated with the side key of the electronic device and comprising:
    a flexible exterior section;
    at least one stiffener element at least partially contained within the flexible exterior section, wherein the at least one stiffener element of the seal section is contiguous with the stiffener of the main seal; and
    a flexible exposed portion adjacent the at least one stiffener element and in communication with the side key;
  wherein movement of the side key as a result of the manual user input is transmitted into movement of the exposed portion to permit the functioning of the side key.

8. The electronic device of claim 7, wherein the flexible exterior section of the seal section is contiguous with the flexible exterior of the main seal.

9. The electronic device of claim 7, wherein the seal section has two discontinuous stiffener elements contiguous with the stiffener of the main seal, and the exposed portion is between the stiffener elements such that the exposed portion moves between the stiffener elements.

10. The electronic device of claim 9, wherein one of the stiffener elements is along a first edge of the side key and the other of the stiffener elements is along a second edge of the side key opposite the first edge.

11. The electronic device of claim 7, wherein the housing comprises a front plate and a back plate that define a gap between the front plate and the back plate, and the main seal and seal section extend around the perimeter of the electronic device along the gap between the front plate and the back plate.

12. The electronic device of claim 11, wherein the side key spans the gap between the front plate and the back plate.

13. The electronic device of claim 7, further comprising a switching element, wherein the movement of the exposed portion activates the switching element, and the activated switching element generates a command signal corresponding to the user input.

14. The electronic device of claim 13, wherein the seal section further comprises an extension opposite the exposed portion and the extension moves against the switching element to activate the switching element.

15. The electronic device of claim 7, wherein the side key is formed integrally with the flexible exterior section of the seal section.

16. The electronic device of claim 7, wherein the electronic device is a mobile telephone.

* * * * *